United States Patent
Maier et al.

(10) Patent No.: US 9,780,744 B2
(45) Date of Patent: Oct. 3, 2017

(54) TRANSCEIVER CIRCUIT FOR COMMUNICATING DIFFERENTIAL AND SINGLE-ENDED SIGNALS VIA TRANSMISSION LINES

(71) Applicant: Robert Bosch GmbH, Stuttgart (DE)

(72) Inventors: Gert Maier, Reutlingen (DE); Manfred Walter, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 15/058,969

(22) Filed: Mar. 2, 2016

(65) Prior Publication Data

US 2016/0268985 A1    Sep. 15, 2016

(30) Foreign Application Priority Data

Mar. 13, 2015    (DE) .................. 10 2015 204 606

(51) Int. Cl.
*H03F 3/45*    (2006.01)
*H03F 1/52*    (2006.01)
*H04B 1/40*    (2015.01)
*H03F 1/56*    (2006.01)
*H03F 3/60*    (2006.01)

(52) U.S. Cl.
CPC ........... *H03F 3/45071* (2013.01); *H03F 1/52* (2013.01); *H03F 1/56* (2013.01); *H03F 3/60* (2013.01); *H04B 1/40* (2013.01); *H03F 2200/222* (2013.01); *H03F 2200/423* (2013.01); *H03F 2200/444* (2013.01)

(58) Field of Classification Search
CPC ....................................... H03F 3/45

USPC ................................... 330/252, 302
See application file for complete search history.

(56) References Cited

U.S. PATENT DOCUMENTS

| | | | | |
|---|---|---|---|---|
| 7,382,189 B2 * | 6/2008 | Chen | ......... | H03F 1/56 330/253 |
| 7,787,830 B2 * | 8/2010 | Goddard | ......... | H04B 1/1615 326/86 |
| 8,237,693 B2 * | 8/2012 | Nishimura | ......... | G09G 3/3688 330/252 |
| 8,269,557 B2 * | 9/2012 | Zametzky | ......... | H03F 1/0222 330/252 |
| 2008/0074187 A1 * | 3/2008 | Chen | ......... | H03F 1/56 330/252 |

\* cited by examiner

*Primary Examiner* — Henry Choe
(74) *Attorney, Agent, or Firm* — Norton Rose Fulbright US LLP; Gerard Messina (57) ABSTRACT

A transmit circuit for sending and/or receiving at least one single-ended signal and for sending a differential signal on two transmission lines, including: a differential amplifier for sending signal parts of a differential signal via the two transmission lines, two impedance matching resistances that are situated between the transmission lines, connected in series, for the impedance matching of the differential amplifier; a switch that is connected in series between the impedance matching resistances; at least one single-ended transmit amplifier for sending or receiving a single-ended signal via an associated one of the transmission lines, each of the at least one single-ended transmit amplifiers being connected to a terminal of the switch that is connected, via the corresponding impedance matching resistance to the associated transmission line.

20 Claims, 3 Drawing Sheets

TRANSCEIVER CIRCUIT FOR COMMUNICATING DIFFERENTIAL AND SINGLE-ENDED SIGNALS VIA TRANSMISSION LINES

RELATED APPLICATION INFORMATION

The present application claims priority to and the benefit of German patent application no. 10 2015 204 606.0, which was filed in Germany on Mar. 13, 2015, the disclosure of which is incorporated herein by reference.

FIELD OF THE INVENTION

The present invention relates to transceiver circuits for sending and receiving electrical signals via transmission lines.

BACKGROUND INFORMATION

In the transmission of electrical signals within an assembly, or between assemblies, it can be required to transmit both differential signals and also non-differential signals, so-called single-ended signals, via transmission lines. This can for example occur if signals have to be transmitted from a plurality of different components, or to a plurality of different components, that provide different types of transmission of a particular signal, differential or single-ended, so that their transceiver circuits have to be matched to one another with regard to a differential and a single-ended signal transmission.

The components are therefore provided with transceiver circuits that have a differential amplifier and that have at least one single-ended transmit amplifier, or a difference amplifier, and at least one receive amplifier.

A transmission of single-ended signals via a transmission line pair from a transmit circuit to a receive circuit, of which at least one has a differential amplifier or a difference amplifier, results in an increased energy consumption. This is because the impedance matching resistance assigned to the differential amplifier of the transmit circuit, required in the case of differential signals, and the terminating resistance assigned to the difference amplifier of the receive circuit causes, in the respective circuit part, a current flow between the two single-ended signals if the signal levels of the single-ended signals on the transmission lines assume different signal levels. The problem is exacerbated in that the voltage levels used for single-ended signals are significantly higher than the voltage levels of differential signal parts. The voltage levels of single-ended signals can be 5 volts, so that for example given an impedance matching resistance/terminating resistance of 100 ohms, a flow of current of 50 mA can result. This relatively high current flow can impair the output signals of the amplifiers of the single-ended signals, or can even exceed their capacity. In addition, this current flow can cause crosstalk between the two single-ended signals, so that the single-ended signals may possibly no longer be capable of being unambiguously recognized by the respective receive circuit. Therefore, it is standard to separate the differential circuit parts using a switch if the transmission lines are used for the transmission of single-ended signals.

Because as a rule the transmission of differential signals takes place at high frequencies, the provision of additional switches for separating the transmit part or receive part for the differential signal in the transmit circuit or in the receive circuit is disadvantageous due to the parasitic capacitances and reflections thereby introduced to the required line branchings, because they can impair the quality of the transmission of the differential signal.

Various approaches are known from the existing art for the separation of the differential circuit parts using one or more switches. These approaches provide either separating only the impedance matching resistance or the terminating resistance for the differential signal or for the overall differential circuit part. In this way, a loss of power at the impedance matching resistance or terminating resistance can be avoided.

The introduction of additional switches and/or line branches can make it more difficult to meet the high demands made on the transmission lines for the transmission of differential signals.

In addition, the provision of only one switch for separating at least the impedance matching resistance/terminating resistance causes, in some approaches, an asymmetrical capacitive load of a transmitted differential signal.

SUMMARY OF THE INVENTION

According to the present invention, a transmit circuit for sending and receiving single-ended signals and for sending differential signals as recited in claim 1, a receive circuit for sending and receiving single-ended signals and for receiving differential signals, and a transmission system as recited in the coordinate claims are provided.

Further embodiments are indicated in the further descriptions herein.

According to a first aspect, a transmit circuit is provided for sending and/or receiving at least one single-ended signal and for sending a differential signal on two transmission lines, including:
  a differential amplifier for sending signal parts of a differential signal via the two transmission lines,
  two impedance matching resistances that are situated between the transmission lines, connected in series, for the impedance matching of the differential amplifier;
  a switch that is connected in series between the impedance matching resistances;
at least one single-ended transmit amplifier for sending or receiving a single-ended signal via an associated one of the transmission lines, each of the at least one single-ended transmit amplifiers being connected to a terminal of the switch that is connected, via the corresponding impedance matching resistance, to the associated transmission line.

The above transmit circuit can be changed over in order either to send or to receive single-ended signals or to send differential signals. The transmit circuit is configured such that no impedance matching resistance of the differential transmit circuit part causes a power loss during the sending and receiving of single-ended signals. In addition, both in the transmission of the single-ended signals and in the sending of the differential signal, no switch is situated in the signal path, so that the parasitic capacitance or the impedance of the switch does not impair the transmission of high-frequency differential signals.

In addition, a first single-ended transmit amplifier can be connected for sending a single-ended signal to a first of the transmission lines, and a second single-ended transmit amplifier can be connected for receiving a single-ended signal from a second of the transmission lines.

It can be provided that a respective level matching resistance is provided in series between a respective output of the differential amplifier and the respective transmission line, in order to match a signal level of a signal part of a differential signal that is to be sent to the transmission lines.

According to a specific embodiment, a control unit can be provided in order to close the switch for the sending of the differential signal and to open the switch for the sending and/or receiving of single-ended signals.

According to a further aspect, a receive circuit is provided for sending and/or receiving at least one single-ended signal and for receiving a differential signal on two transmission lines, including:
  a difference amplifier for receiving signal parts of a differential signal via the two transmission lines and for providing a corresponding output signal,
  two terminating resistances that are situated between the transmission lines, connected in series, for line termination;
  a switch that is connected in series between the terminating resistances;
  at least one single-ended receive amplifier for sending and/or receiving a single-ended signal on an associated one of the transmission lines, each of the at least one single-ended receive amplifiers being connected to a terminal of the switch that is connected, via the corresponding terminating resistance, to the associated transmission line.

The above receive circuit can be changed over in order either to send or to receive single-ended signals or to receive differential signals. The transmit circuit is configured such that no impedance matching resistance of the differential receive circuit part during the sending and receiving of single-ended signals causes a power loss. In addition, both during the transmission of the single-ended signals and during the receiving of the differential signal, no switch is situated in the signal path, so that the parasitic capacitance or the impedance of the switch does not impair the transmission of high-frequency differential signals.

In addition, a first single-ended receive amplifier can be connected for sending a single-ended signal to a first of the transmission lines, and a second single-ended receive amplifier can be connected for receiving a single-ended signal from a second of the transmission lines.

According to a specific embodiment, inputs of the difference amplifier can each be provided with a protective circuit having a protective resistance connected in series and a protective diode that connects the corresponding input of the difference amplifier to a fixedly specified potential.

A control unit can be provided for closing the switch in order to receive the differential signal and for opening the switch in order to send and/or receive single-ended signals.

According to a further aspect, a transceiver circuit is provided for sending and receiving at least one single-ended signal and for sending and receiving a differential signal via/on two transmission lines, including:
  a transceiver difference amplifier for sending and/or receiving signal parts of a differential signal via the two transmission lines,
  two coupling resistances that are situated between the transmission lines, connected in series, for line termination;
  a switch that is connected in series between the coupling resistances;
  at least one single-ended transceiver amplifier for sending and/or receiving a single-ended signal on an associated one of the transmission lines, each of the at least one single-ended transceiver amplifiers being connected to a terminal of the switch that is connected, via the corresponding coupling resistance, to the associated transmission line.

In addition, a first single-ended transceiver amplifier can be connected for sending and/or receiving a single-ended signal on a first of the transmission lines, and a second single-ended transceiver amplifier can be connected for sending and/or receiving a single-ended signal from a second of the transmission lines.

According to a specific embodiment, inputs of the transceiver difference amplifier can each be provided with a protective circuit that has a protective resistance connected in series and a protective diode that connects the corresponding terminal of the transceiver difference amplifier to a fixedly specified potential.

A control unit can be provided for closing the switch in order to receive the differential signal and for opening the switch in order to send and/or receive single-ended signals.

According to a further aspect, a transmission system is provided, including:
  the above transmit circuit or the above transceiver circuit,
  a receive circuit for sending and/or receiving single-ended signals, a receive circuit for receiving differential signals, or the above receive circuit,
  transmission lines in order to transmit differential signals or single-ended signals between the transmit circuit and the receive circuit.

According to a further aspect, a transmission system is provided, including:
  the above receive circuit or the above transceiver circuit,
  a transmit circuit for sending and/or receiving single-ended signals, or a transmit circuit for sending differential signals,
  transmission lines in order to transmit differential signals or single-ended signals between the transmit circuit and the receive circuit.

Specific embodiments are explained in more detail in the following on the basis of the accompanying drawings.

DETAILED DESCRIPTION

Figure 1:
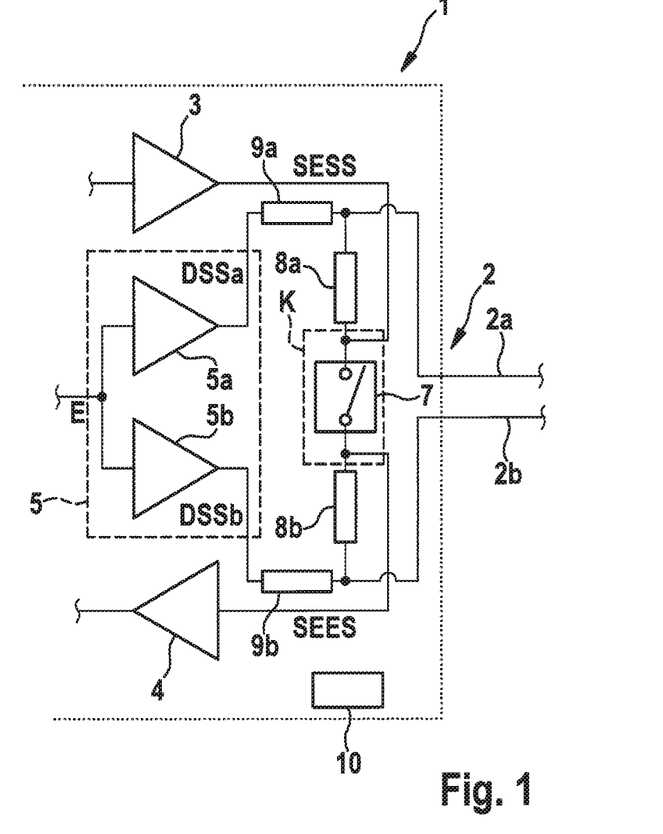
FIG. 1 shows a schematic representation of a transmit circuit for sending and receiving single-ended signals and for sending differential signals via a transmission line pair.

FIG. 1 shows a schematic representation of a transmit circuit 1 with which, optionally, either single-ended signals can be sent/received, or differential signals can be sent, via a first and a second transmission line 2a, 2b of a transmission line pair 2. Transmit circuit 1 includes a first single-ended driver, or a first single-ended transmit amplifier 3, for providing a single-ended transmit signal SESS that is to be sent via first transmission line 2a of transmission line pair 2, and a second single-ended driver, or a second single-ended transmit amplifier 4, for receiving a single-ended receive signal SEES. The design of first and second single-ended transmit amplifier 3 can correspond to conventional amplifier circuits.

In addition, transmit circuit 1 includes, for the sending of differential signals, a differential transmit amplifier 5 (differential driver) having a first and a second differential amplifier part 5a, 5b, having essentially the same design, in order to transmit a corresponding signal part of the differential signals via first or second transmission line 2a, 2b of transmission line pair 2. The signal parts are produced from an input signal E supplied to amplifier parts 5a, 5b. One of the two differential amplifier parts 5a, 5b, in the present exemplary embodiment second differential amplifier part 5b, has an inverter at the input side, or receives an inverted input signal.

An output terminal of first single-ended transmit amplifier 3 is connected to a first terminal of a switch 7, in particular directly or immediately, i.e. without intentional impedance. Switch 7 may be configured as an FET component, and can be switched into a high-ohmic and a low-ohmic state. Other realizations of switch 7, e.g. in the form of a mechanical switch, are also conceivable.

In addition, the first terminal of switch 7 (or the output of first single-ended transmit amplifier 3) is connected, via a first impedance matching resistance 8a, to first transmission line 2a, and the second terminal of switch 7 (or the input of second single-ended transmit amplifier 4) is connected, via a second impedance matching resistance 8b, to second transmission line 2b of transmission line pair 2. In addition, an output of first differential amplifier part 5a is connected, via a first level matching resistance 9a, to first transmission line 2a, and the output of second differential amplifier part 5b is connected, via a second level matching resistance 9b, to second transmission line 2b.

With the aid of level matching resistances 9a, 9b, the signal level for the differential signals specified for the transmission of the differential signal by the LVDS standard can be set. However, other differential signal levels are also possible. The signal levels of the differential signal parts result in each case from the voltage dividers formed from first or second level matching resistance 9a, 9b and first or second impedance matching resistance 8a, 8b, so that the voltage of the differential signals can be set to voltage levels of +/−400 mV, independent as much as possible of how the output voltages of first or second differential amplifier part 5a, 5b are.

In order to ensure the symmetry of the transmission behavior of transmit circuit 1 despite the use of only one switch 7, the standardly used one-part impedance matching resistance is divided into two impedance matching resistances 8a, 8b, between which switch 7 is situated, so that impedance matching resistances 8a, 8b and switch 7 are connected in series to one another. By opening switch 7, impedance matching resistances 8a, 8b can be separated from one another and thus deactivated.

For the transmission of differential signals, switch 7 is closed e.g. by a control unit 10 that can be part of transmit circuit 1 or can be fashioned separately therefrom. The parasitic capacitance of switch 7 is in the middle of the two impedance matching resistances 8a, 8b. Because in the case of a differential signal the voltages at the ends of the center nodes formed by the connection together of impedance matching resistances 8a, 8b have to be controlled opposite to one another, center node M of the overall impedance matching resistance formed in this way rests at an approximately constant level. As a result, the parasitic capacitance that exists here does not have to be dynamically recharged, and is therefore effectively not present, or is without influence, for the differential signal.

Impedance matching resistances 8a and 8b can have the same resistance value in order to achieve a symmetry at the differential circuit center point. Moreover, switch 7 is to be selected such that when closed its resistance is as small as possible, and in particular is smaller than one one-thousandth of the resistance of one of impedance matching resistances 8a, 8b. In this way, it is achieved that the resistance of switch 7 in the closed state (i.e. during differential operation) becomes practically negligible, and the same signal is present at both sides of switch 7, namely the differential center point. In the case of a differential signal, this center point is however at rest, and corresponds to the so-called common-mode voltage.

The parasitic capacitances of the output terminal of interactive first single-ended transmit amplifier 3 and of the input terminal of inactive second single-ended transmit amplifier 4 are between the two impedance matching resistances 8a, 8b, due to the immediate coupling with switch 7. In this way, these also have no influence on the transmission of the differential signal, because the signal is at rest and the parasitic capacitances cannot be recharged, but rather can be charged only once, upon the first activation, to this common-mode voltage.

Due to the fact that single-ended transmit amplifiers 3, 4 are connected directly between impedance matching resistances 8a, 8b, possible signal reflections are also not present, because the potential at center node K formed by closed switch 7 has a constant level, or has only slight fluctuations.

In addition, through the center node formed by closed switch 7, the output terminal of first single-ended transmit amplifier 3 and the input terminal of second single-ended transmit amplifier 4 can be connected to one another, so that in this way an impedance asymmetry between the input or output terminals of the two single-ended transmit amplifiers 3, 4 in differential operation is irrelevant. In this way, it is not necessary to take into account, in the circuit design, the symmetry of the capacitances of the output terminal of first single-ended transmit amplifier 3 and of the input terminal of second single-ended transmit amplifier 4.

For the transmission of single-ended signals, for which purpose switch 7 of transmit circuit 1 is open, the output capacitances of the output terminals of first and second differential amplifier part 5a, 5b are separated by relatively high-ohmic level matching resistances 9a, 9b.

In alternative specific embodiments, transmit circuit 1 can also have, instead of first and second transmit amplifier 3, 4, only the first or only the second transmit amplifier 3, 4.

Figure 2:
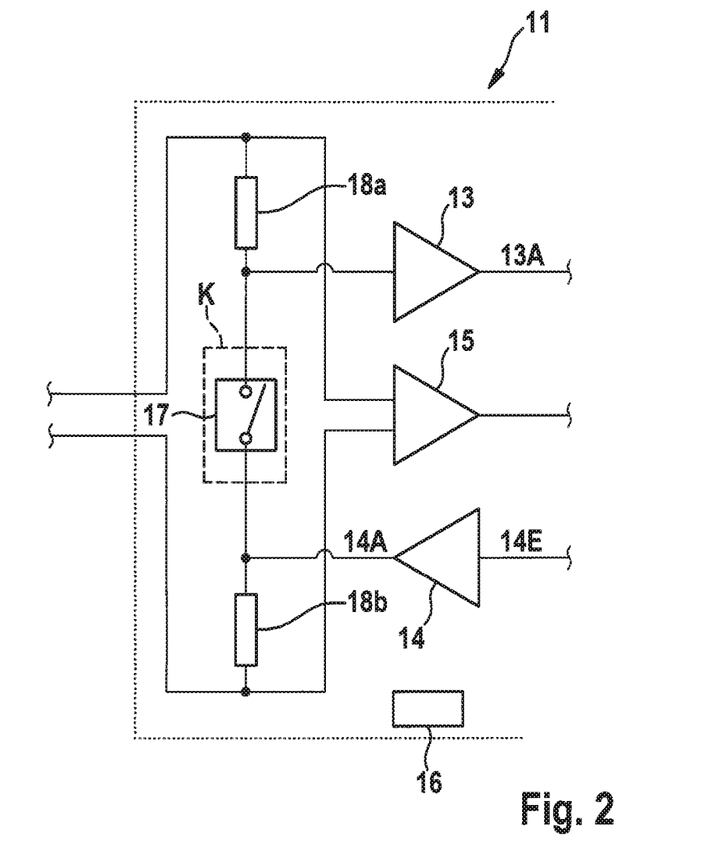
FIG. 2 shows a schematic representation of a receive circuit for sending and receiving single-ended signals and for receiving differential signals.

In FIG. 2, a receive circuit 11 is shown that has a first single-ended receive amplifier 13 and a second single-ended receive amplifier 14 for receiving or sending single-ended signals, and a receive difference amplifier 15 for receiving differential signals. The input terminals of difference amplifier 15 are connected immediately to transmission lines 2a, 2b of transmission line pair 2, so that a differential signal applied thereto causes a corresponding voltage difference over the input terminals of difference amplifier 15.

In addition, first transmission line 2a is connected, via a first terminating resistance 18a, to a first terminal of a switch 17, and second transmission line 2b is connected, via a second terminating resistance 18b, to a second terminal of switch 17. In addition, the first terminal of switch 17 is connected to an input terminal of first single-ended receive amplifier 13. In addition, the second terminal of switch 17 is connected to an output terminal of second single-ended receive amplifier 14. The resistance values of terminating resistances 18*a*, 18*b* may have the same resistance value, which is significantly higher (e.g. by more than a factor of 1000) than a resistance value of closed switch 17.

The two terminating resistances 18*a*, 18*b* form an overall terminating resistance between which switch 17 is situated in a series connection. For the reception of differential signals, switch 17 is closed, e.g. by a control unit 16 that can be fashioned as part of the receive circuit or separately therefrom, and in this way the overall terminating resistance is activated. The parasitic capacitance of switch 17 is then in the middle of the overall terminating resistance, and forms a center node K. Because in the case of a differential signal the voltages at the ends of the terminating resistance run opposite to one another, the potential at center node K rests at a constant level. As a consequence, the capacitance present here does not have to be dynamically recharged, and is thus effectively without effect for the differential signal.

Because the output terminal of first single-ended receive amplifier 13 and the input terminal of second single-ended receive amplifier 14 are adjacent to common center node K via closed switch 17, the corresponding parasitic capacitances of receive amplifiers 13, 14 also have no effect. The line branching at the node formed by closed switch 17 does not cause reflections of differential signal parts at these lines, because the node formed by closed switch 17 is at a constant potential. Thus, there is no impairment of the quality of the differential signal.

Because in the closed state switch 17 is relatively low-ohmic, the two terminals for single-ended receive amplifiers 13, 14 are electrically connected in low-ohmic fashion, so that a possible asymmetry between the capacitances or impedances of the input terminal of first single-ended receive amplifier 13 or of the output terminal of second single-ended receive amplifier 14 are irrelevant to the differential case, i.e. do not have an effect. In single-ended operation, switch 17 is open, so that single-ended receive amplifiers 13, 14 are connected to transmission lines 2*a*, 2*b* through the respective terminating resistances 18*a*, 18*b*. These do not represent any impairment, because the input or output impedances of single-ended receive amplifiers 13, 14 are relatively high-ohmic.

For both transmit circuit 1 and for receive circuit 11, it is true that the level of the additional capacitive loading of the differential signal that is to be sent in the case of transmit circuit 1, or of the differential signal that is to be received in the case of receive circuit 11, is very low, because single-ended transmit amplifiers 3, 4 and single-ended receive amplifiers 13, 14 are connected in the middle of impedance matching resistances 8*a*, 8*b*, or of terminating resistances 18*a*, 18*b*, so that the capacitances thereof do not impair the transmission of the differential signal.

In addition, the capacitive loading of the differential signal due to the single-ended transmit or receive amplifiers 3, 4, 13, 14 connected to one another by closed switch 7, 17 is symmetrical. Due to the use of only one switch 7, 17 in transmit circuit 1 or in receive circuit 11, the additional capacitive load thereby introduced is lower than in circuits known from the existing art. In addition, possible reflections due to the line branchings in transmit circuit 1 or in receive circuit 11 can be kept low through the connection together at a single center node K (with closed switches 7, 17) in the case of a differential transmission.

In alternative specific embodiments, receive circuit 11 can also have, instead of first and second transmit amplifier 13, 14, only the first or only the second transmit amplifier 13, 14.

Figure 3:
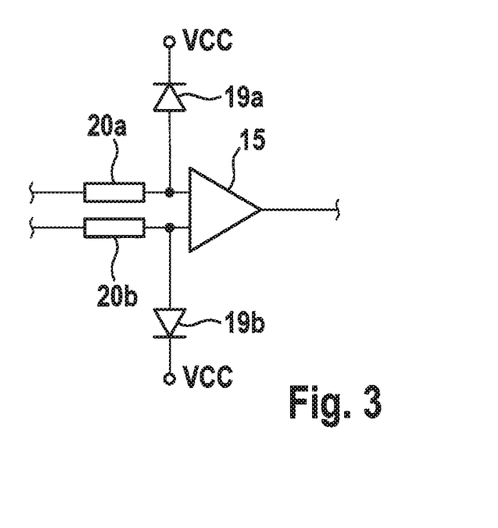
FIG. 3 shows a schematic representation of an optional receive circuit having a protective circuit for protecting a differential receive part against high voltage levels of received single-ended signals.

In FIG. 3, for receive circuit 11 a protective device is shown, so that increased voltages in the transmission of single-ended signals do not damage difference amplifier 15. This can be achieved by coupling the input terminals of difference amplifier 15, via corresponding diodes 19*a*, 19*b*, to a respective specified reference potential in connection with protective resistances 20*a*, 20*b*, connected upstream in series. Increased voltages are thus limited by the corresponding diodes 19*a*, 19*b*.

Figure 4:
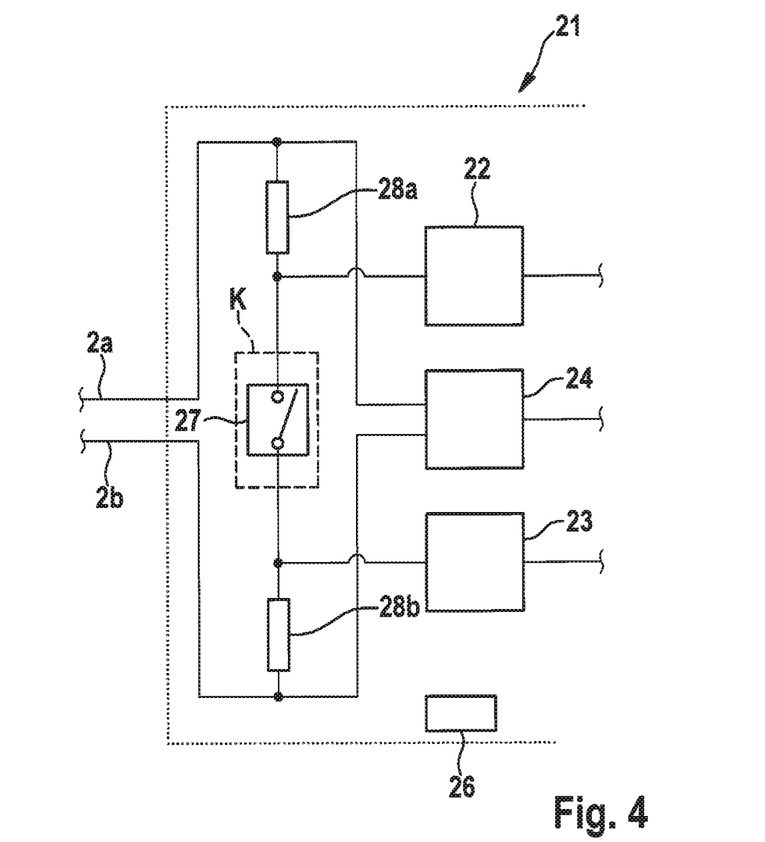
FIG. 4 shows a schematic representation of a transceiver circuit for sending and receiving single-ended signals and for sending and receiving differential signals.

FIG. 4 shows a transceiver circuit 21 that has a first single-ended transceiver amplifier 22 and a second single-ended transceiver amplifier 23, respectively for the sending and receiving of single-ended signals, and a transceiver amplifier difference amplifier 24 for sending and receiving differential signals. A transceiver corresponds to a combined transmit and receive unit that can send or receive a signal depending on its operating mode.

The first terminals of transceiver difference amplifier 24 are connected immediately to transmission lines 2*a*, 2*b* of transmission line pair 2, so that, depending on the operating mode, a differential signal applied thereto causes a corresponding detectable voltage difference over the first terminals of transceiver difference amplifier 24, or so that a differential signal can be applied over the first terminals of transceiver difference amplifier 24.

In addition, first transmission line 2*a* is connected to a first terminal of a switch 27 via a first coupling resistance 28*a*, and second transmission line 2*b* is connected to a second terminal of switch 27 via a second coupling resistance 28*b*. In addition, the first terminal of switch 27 is connected to a first terminal of first transceiver amplifier 22. In addition, the second terminal of switch 27 is connected to a first terminal of second transceiver amplifier 23. The resistance values of coupling resistances 28*a*, 28*b* may have the same resistance value, which is significantly higher (e.g. by more than a factor of 1000) than a resistance value of closed switch 27.

Depending on the operating mode, the two coupling resistances 28*a*, 28*b* form an overall impedance matching resistance or an overall terminating resistance between which switch 27 is situated, in a series connection.

For the reception of differential signals, switch 27 is closed, e.g. by a control unit 26 that can be fashioned as part of transceiver circuit 21 or separately therefrom, and in this way the overall coupling resistance 28*a*, 28*b* is activated as terminating resistance, with the effect described above.

For the sending of differential signals, switch 27 is also closed, for example by control unit 26, and in this way the overall coupling resistance is activated as impedance matching resistance, with the effect described above.

Because the terminal of first transceiver amplifier 22 and the terminal of second transceiver amplifier 23 are adjacent to common center node K via closed switch 27, the corresponding parasitic capacitances of transceiver amplifiers 22, 23 are also without effect. The line branching at the node formed by a closed switch 27 does not cause reflections of differential signal parts on these lines, because node K formed by closed switch 27 is at a constant potential. Thus, there is no impairment of the quality of the differential signal.

Because in the closed state switch 27 is relatively low-ohmic, the two terminals for transceiver amplifiers 22, 23 are connected in electrically low-ohmic fashion, so that a possible asymmetry between the capacitances or impedances of the terminals of first transceiver amplifier 22 or of second transceiver amplifier 23 are irrelevant, i.e. have no effect, in the differential case. In single-ended operation, switch 27 is open, so that single-ended transceiver amplifiers 22, 23 are connected, via respective coupling resistances 28*a*, 28*b*, to transmission lines 2*a*, 2*b*. This does not represent an impairment, because the input or output impedances of single-ended transceiver amplifiers 22, 23 are relatively high-ohmic.

For transceiver circuit 21, it is true that the level of the additional capacitive loading of a differential signal that is to be sent, or of a differential signal that is to be received, is very low, because single-ended transceiver amplifiers 22, 23 are connected in the center of coupling resistances 28a, 28b, so that their capacitances do not impair the transmission of the differential signal.

In addition, the capacitive loading of the differential signal is symmetrical, due to the single-ended transceiver amplifiers 22, 23, connected to one another by closed switch 27. Through the use of only one switch 27, the additional capacitive load thereby introduced is lower than in circuits known from the existing art. In addition, possible reflections due to the line branchings can also be kept low through the connection together at a single center node K in the case of a differential transmission.

From the two above-described transceiver circuits 21, a transmission system can be provided that is configured for the bidirectional transmission of signals. In this way, the transmission path in the single-ended case can be operated in each direction, or even in alternating fashion (indeed, with both lines independent of one another). In differential operation, the transmission path can also be operated in each direction, or even in alternating fashion in both directions.

What is claimed is:

1. A transmit circuit for at least one of sending and receiving at least one single-ended signal and for sending a differential signal on two transmission lines, comprising:
    a differential amplifier configured to output a first signal part of a differential signal onto a first of the two transmission lines and to output a second signal part of the differential signal onto a second of the two transmission lines;
    two impedance matching resistances connected in series between the two transmission lines for the impedance matching of the differential amplifier;
    a switch connected in series between the impedance matching resistances; and
    at least one single-ended transmit amplifier, each being configured for sending or receiving a single-ended signal via an associated one of the transmission lines, each of the at least one single-ended transmit amplifiers being connected to a terminal of the switch that is connected, via a corresponding one of the impedance matching resistances, to the associated transmission line.

2. The transmit circuit of claim 1, wherein a first single-ended transmit amplifier is connected for sending a single-ended signal on a first of the transmission lines and a second single-ended transmit amplifier is connected for receiving a single-ended signal from a second of the transmission lines.

3. The transmit circuit of claim 1, wherein a level matching resistance is respectively connected in series between a respective output of the differential amplifier and the respective transmission line to match a signal level of a signal part of a differential signal that is to be sent to the transmission lines.

4. The transmit circuit of claim 1, further comprising:
    a control unit to close the switch to send the differential signal, and to open the switch to send and/or receive single-ended signals.

5. The transmit circuit of claim 1, wherein the differential amplifier is part of a transceiver difference amplifier and/or the at least one transmit amplifier is part of a transceiver amplifier.

6. A receive circuit for at least one of sending and receiving at least one single-ended signal and for receiving a differential signal on two transmission lines, comprising:
    a difference amplifier configured to receive a first signal part of a differential signal from a first of the two transmission lines, receive a second signal part of the differential signal from a second of the two transmission signals, and output a corresponding output signal based on the received first and second signal parts;
    two terminating resistances for line termination connected in series between the two transmission lines;
    a switch connected in series between the terminating resistances; and
    at least one single-ended receive amplifier, each being configured for sending or receiving a single-ended signal on an associated one of the transmission lines, each of the at least one single-ended receive amplifiers being connected to a terminal of the switch that is connected, via a corresponding one of the terminating resistances, to the associated transmission line.

7. The receive circuit of claim 6, wherein a first single-ended receive amplifier is connected for sending a single-ended signal on a first of the transmission lines and a second single-ended receive amplifier is connected for receiving a single-ended signal from a second of the transmission lines.

8. The receive circuit of claim 6, wherein inputs of the difference amplifier each have a protective circuit, having a protective resistance, connected in series, and a protective diode that connects the corresponding input of the difference amplifier to a fixedly specified potential.

9. The receive circuit of claim 6, further comprising:
    a control unit to close the switch to receive the differential signal, and to open the switch to send and/or receive single-ended signals.

10. A transceiver circuit for sending and receiving at least one single-ended signal and for sending and receiving a differential signal via two transmission lines, comprising:
    a transceiver difference amplifier configured to at least one of:
        output a first output signal part of an output differential signal onto a first of the two transmission lines and output a second output signal part of the differential signal onto a second of the transmission lines; and
        receive a first input signal part of an input differential signal from the first of the two transmission lines, receive a second input signal part of the input differential signal from the second of the two transmission lines, and output a corresponding signal based on the received first and second input signal parts;
    two coupling resistances for line termination connected in series between the two transmission lines;
    a switch connected in series between the coupling resistances; and
    at least one single-ended transceiver amplifier for at least one of sending and receiving a single-ended signal on an associated one of the transmission lines, each of the at least one single-ended transceiver amplifiers being connected to a terminal of the switch that is connected, via a corresponding one of the coupling resistances, to the associated transmission line.

11. The transceiver circuit of claim 10, wherein a first single-ended transceiver amplifier is connected for sending and/or receiving a single-ended signal on a first of the transmission lines, and a second single-ended transceiver amplifier is connected for sending and/or receiving a single-ended signal from a second of the transmission lines.

12. The transceiver circuit of claim 10, wherein inputs of the transceiver difference amplifier each include a protective circuit, which have a protective resistance connected in series and a protective diode that connects the corresponding terminal of the transceiver difference amplifier to a fixedly specified potential.

13. The transceiver circuit of claim 10, further comprising:
a control unit to close the switch to receive the differential signal, and to open the switch to send and/or receive single-ended signals.

14. A transmission system, comprising:
one of a transmit circuit and a transceiver circuit; one of a receive circuit for sending and/or receiving single-ended signals, differential signals, and a receive circuit; and
transmission lines to transmit differential signals or single-ended signals between the transmit circuit and the receive circuit;
wherein the transmit circuit is for sending and/or receiving at least one single-ended signal and for sending a differential signal on two transmission lines, including:
a differential amplifier for sending signal parts of a differential signal via the two transmission lines;
two impedance matching resistances situated between the transmission lines, connected in series, for the impedance matching of the differential amplifier;
a switch connected in series between the impedance matching resistances; and
at least one single-ended transmit amplifier for sending or receiving a single-ended signal via an associated one of the transmission lines, each of the at least one single-ended transmit amplifiers being connected to a terminal of the switch that is connected, via the corresponding impedance matching resistance to the associated transmission line;
wherein the transceiver circuit is for sending and receiving at least one single-ended signal and for sending and receiving a differential signal via/on two transmission lines, including:
a transceiver difference amplifier for sending and/or receiving signal parts of a differential signal via the two transmission lines;
two coupling resistances situated, for line termination, between the transmission lines, connected in series;
a switch connected in series between the coupling resistances; and
at least one single-ended transceiver amplifier for sending and/or receiving a single-ended signal on an associated one of the transmission lines, each of the at least one single-ended transceiver amplifiers being connected to a terminal of the switch that is connected, via the corresponding coupling resistance, to the associated transmission line; and
wherein the receive circuit is for sending and/or receiving at least one single-ended signal, or for receiving a differential signal on two transmission lines, includes:
a difference amplifier for receiving signal parts of a differential signal via the two transmission lines, and for providing a corresponding output signal;
two terminating resistances situated, for line termination, between the transmission lines, connected in series;
a switch connected in series between the terminating resistances; and
at least one single-ended receive amplifier for sending and/or receiving a single-ended signal on an associated one of the transmission lines, each of the at least one single-ended receive amplifiers is connected to a terminal of the switch that is connected, via the corresponding terminating resistance to the associated transmission line.

15. A transmission system, comprising:
one of a receiver circuit and a transceiver circuit; a transmit circuit for sending and/or receiving single-ended signals or a transmit circuit for sending differential signals; and
transmission lines to transmit differential signals or single-ended signals between the transmit circuit and the receive circuit;
wherein the transmit circuit is for sending and/or receiving at least one single-ended signal and for sending a differential signal on two transmission lines, including:
a differential amplifier for sending signal parts of a differential signal via the two transmission lines;
two impedance matching resistances situated between the transmission lines, connected in series, for the impedance matching of the differential amplifier;
a switch connected in series between the impedance matching resistances; and
at least one single-ended transmit amplifier for sending or receiving a single-ended signal via an associated one of the transmission lines, each of the at least one single-ended transmit amplifiers being connected to a terminal of the switch that is connected, via the corresponding impedance matching resistance to the associated transmission line;
wherein the transceiver circuit is for sending and receiving at least one single-ended signal and for sending and receiving a differential signal via/on two transmission lines, including:
a transceiver difference amplifier for sending and/or receiving signal parts of a differential signal via the two transmission lines;
two coupling resistances situated, for line termination, between the transmission lines, connected in series;
a switch connected in series between the coupling resistances; and
at least one single-ended transceiver amplifier for sending and/or receiving a single-ended signal on an associated one of the transmission lines, each of the at least one single-ended transceiver amplifiers being connected to a terminal of the switch that is connected, via the corresponding coupling resistance, to the associated transmission line; and
wherein the receive circuit is for sending and/or receiving at least one single-ended signal, or for receiving a differential signal on two transmission lines, includes:
a difference amplifier for receiving signal parts of a differential signal via the two transmission lines, and for providing a corresponding output signal;
two terminating resistances situated, for line termination, between the transmission lines, connected in series;
a switch connected in series between the terminating resistances; and
at least one single-ended receive amplifier for sending and/or receiving a single-ended signal on an associated one of the transmission lines, each of the at least one single-ended receive amplifiers is connected to a terminal of the switch that is connected, via the corresponding terminating resistance to the associated transmission line.

16. The transmit circuit of claim 1, wherein the at least one single-ended transmit amplifier includes a single-ended transmit amplifier that is connected to a terminal of the switch that is connected to one of the transmission lines via one of the impedance matching resistances, via which impedance matching resistance the single-ended transmit amplifier is configured to receive the single-ended signal from the one of the transmission lines.

17. The transmit circuit of claim 1, wherein the at least one single-ended transmit amplifier includes a single-ended transmit amplifier that is connected to a terminal of the switch that is connected to one of the transmission lines via one of the impedance matching resistances, via which impedance matching resistance the single-ended transmit amplifier is configured to transmit the single-ended signal to the one of the transmission lines.

18. The transmit circuit of claim 1, wherein the transmit circuit is configured for the switch to:
   open in order for the single-ended signal to be received or transmitted via the at least one single-ended transmit amplifier and a respective one of the two transmission lines; and
   close in order for the differential amplifier to transmit the first and second signal parts using the two transmission lines.

19. The transmit circuit of claim 1, wherein each of the at least one single-ended transmit amplifier is connected on a path between the terminal of the switch and the one of the impedance matching resistances.

20. The transmit circuit of claim 19, wherein the circuit is configured for the single-ended signal to transmit between the respective single-ended transmit amplifier and an input or output terminal of the associated line via the corresponding impedance matching resistance.

* * * * *